United States Patent
Lin et al.

(10) Patent No.: US 7,885,109 B2
(45) Date of Patent: Feb. 8, 2011

(54) MEMORY AND METHOD FOR DISSIPATION CAUSED BY CURRENT LEAKAGE

(75) Inventors: Wen-Pin Lin, Changhua County (TW); Shyh-Shyuan Sheu, Taichung (TW); Lieh-Chiu Lin, Kaohsiung (TW); Pei-Chia Chiang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 39 days.

(21) Appl. No.: 12/273,414

(22) Filed: Nov. 18, 2008

(65) Prior Publication Data
US 2009/0141548 A1   Jun. 4, 2009

(30) Foreign Application Priority Data
Dec. 3, 2007   (TW) .............................. 96145894 A

(51) Int. Cl.
G11C 11/04 (2006.01)
(52) U.S. Cl. .............................. 365/185.05; 365/185.15
(58) Field of Classification Search .................. 365/148
See application file for complete search history.

(56) References Cited

U.S. PATENT DOCUMENTS

| | | | |
|---|---|---|---|
| 6,992,365 B2 | 1/2006 | Xu et al. | |
| 2003/0203558 A1 | 10/2003 | Lowrey | |
| 2005/0169095 A1* | 8/2005 | Bedeschi et al. | 365/232 |
| 2008/0285326 A1* | 11/2008 | Alami et al. | 365/72 |

FOREIGN PATENT DOCUMENTS

CN   1414563 A   4/2003

OTHER PUBLICATIONS

Y.H Ha et al., "An Edge Contact Type Cell for Phase Change RAM Featuring Very Low Power Consumption", pp. 175-176, 2003 Symposium on VLSI Technology Digest of Technical Papers, US.

* cited by examiner

*Primary Examiner*—Hoai V Ho
*Assistant Examiner*—Anthan T Tran

(57) ABSTRACT

Memories with low power consumption and methods for suppressing current leakage of a memory. The memory cell of the memory has a storage element and a transistor coupled in series. The invention sets a voltage across the transistor approaching to zero when the memory is not been accessed.

12 Claims, 4 Drawing Sheets

MEMORY AND METHOD FOR DISSIPATION CAUSED BY CURRENT LEAKAGE

CROSS REFERENCE TO RELATED APPLICATIONS

This application claims priority of Taiwan Patent Application No. 096145894, filed on Dec. 3, 2007, the entirety of which is incorporated by reference herein.

BACKGROUND OF THE INVENTION

1. Field of the Invention

The invention relates to a memory, more particularly to a memory with a current leakage suppressor.

2. Description of the Related Art

FIG. 1 illustrates the structure of a conventional memory. Each memory cell 102 includes a storage element 104 and a transistor 106 that are coupled in series. The storage element may be a phase change storage element. Each bit line BL relates to a bit line selector 108. The current generator 110 is operable to generate a control current I that is sent into the storage elements according to the states of the bit line selectors and the transistors, wherein the states of the transistors are controlled by word line control signals WL0~WLN. In a case wherein the storage element 104 is a phase change element, the state of the storage element 104 is dependent on the current flowing therethrough, and may be switched between a read state, a crystalline state and an amorphous state. The crystalline state and the amorphous state relate to low impedance and high impedance, respectively, and are used to represent digital value '0' and '1'.

In an ideal case, the control current I should be zero when the memory is not being accessed. However, a small control current I still flows out from the current generator 110 because of current leakage, and the transistors, such as the transistor 106, of the memory cells are not completely turned off because of the current leakage thereof. Thus, although the memory may not be accessed, power consumption of the memory may be wasted, and inexorably high.

BRIEF SUMMARY OF THE INVENTION

The invention discloses memories including a current generator, a bit line, a memory cell coupled to the bit line, and a current leakage suppressor. The current generator provides a control current. The memory cell includes a storage element and a transistor that are coupled in series, wherein the state of the transistor is controlled by a word line signal. When the transistor and a bit line selector corresponding to the bit line are turned on, the current generator is coupled to the memory cell to provide a current to flow through the storage element. When the memory is not being accessed, the current leakage suppressor forces the voltage across the transistor to be zero so that the current approaches to zero.

The invention further provides methods for suppressing current leakage of a memory. The memory includes at least one memory cell which includes a storage element and a transistor coupled in series. The methods set the voltage across the transistor to be zero so that the current approaches to zero when the memory is not being accessed.

The above and other advantages will become more apparent with reference to the following description taken in conjunction with the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description shows some embodiments carrying out the invention. This description is made for the purpose of illustrating the general principles of the invention and should not be taken in a limiting sense. The scope of the invention is best determined by reference to the appended claims.

Figure 1:
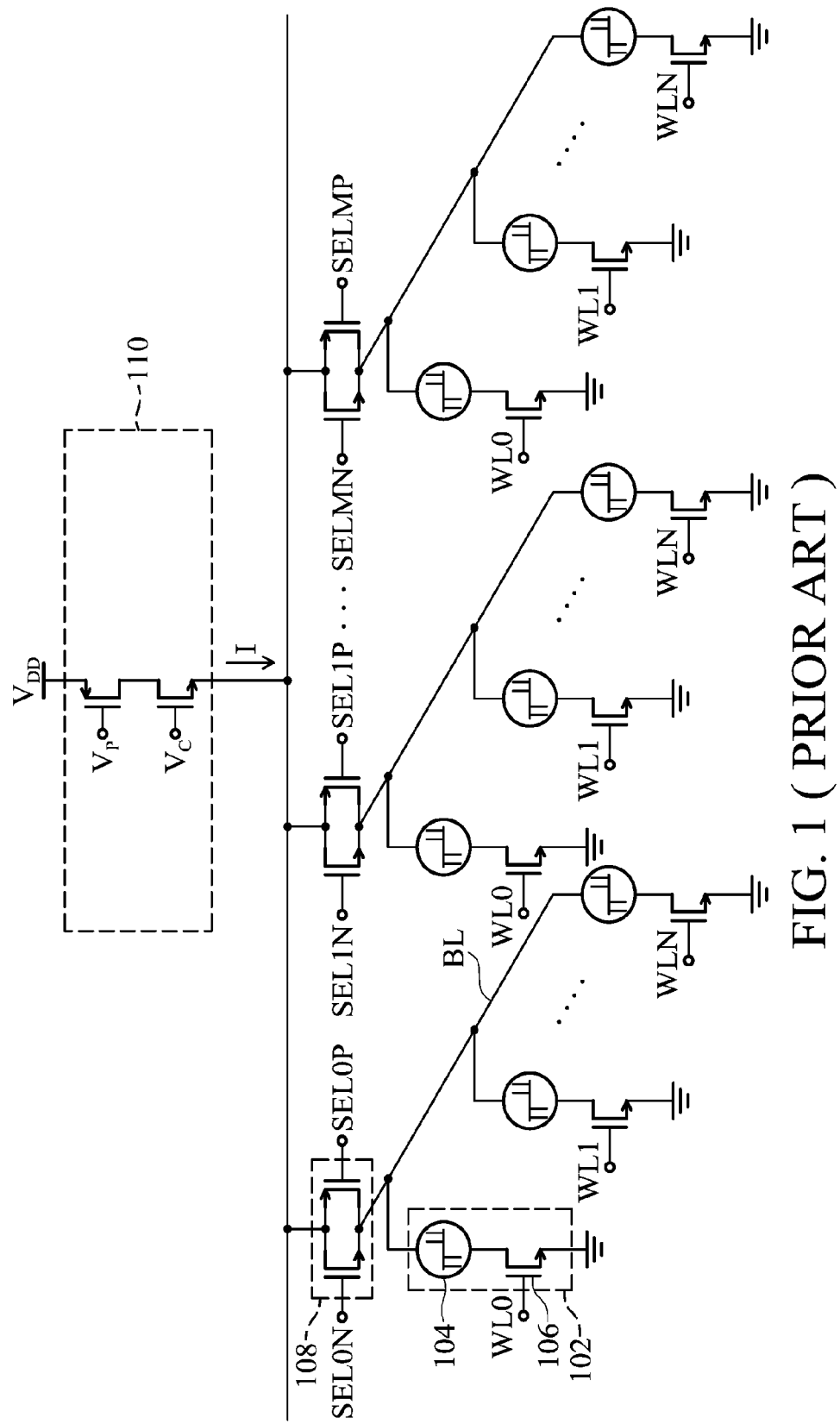
FIG. 1 illustrates a conventional memory.
Figure 2:
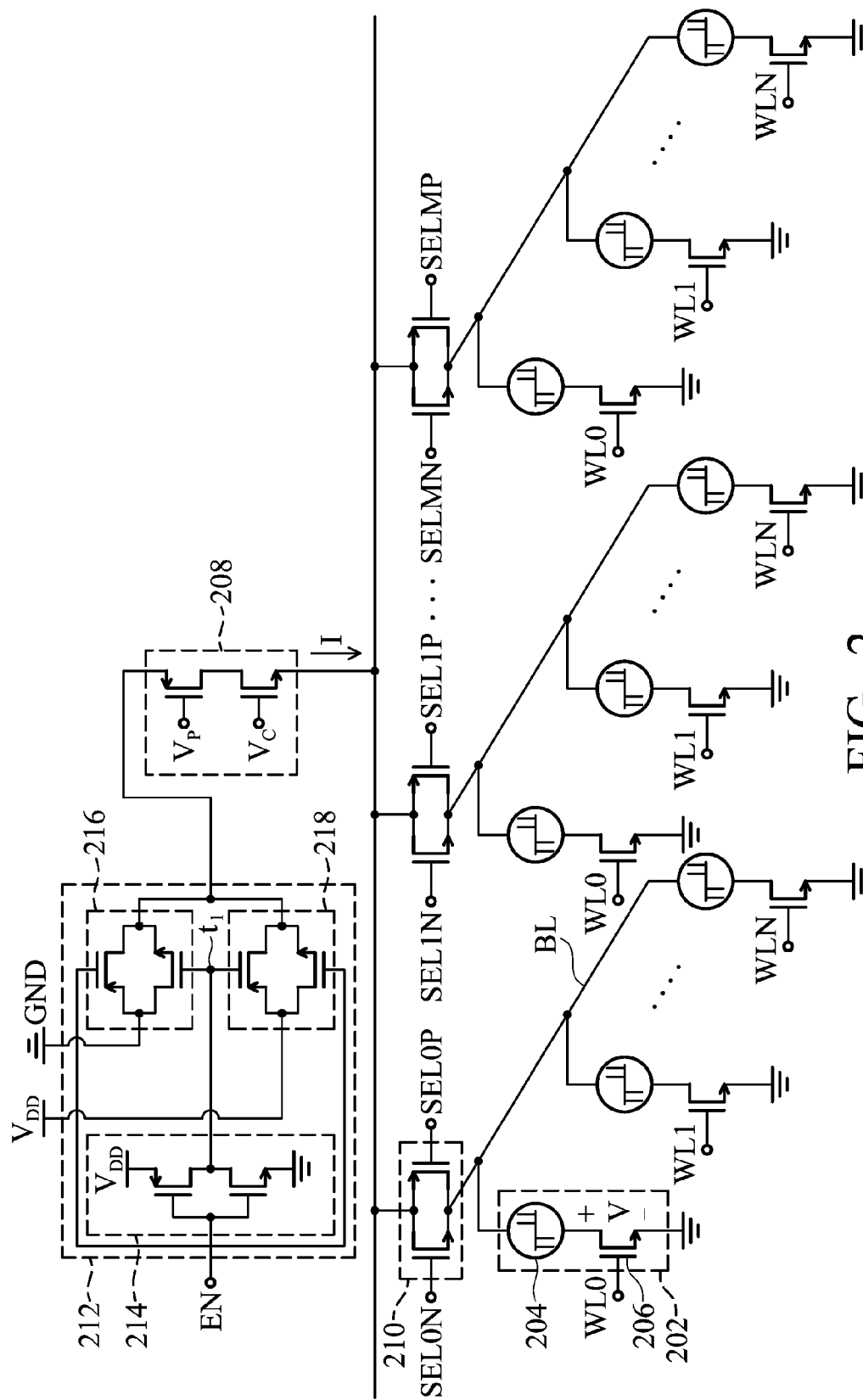
FIG. 2 illustrates an embodiment of the invention.

FIG. 2 illustrates an embodiment of the memory of the invention. A memory cell 202 includes a storage element 204 and a transistor 206 that are coupled in series. The transistor 206 is controlled by a word line signal WL0. A current generator 208 generates a control current I, which flows through the storage element 204 to control the state of the storage element 204 when a bit line selector 210 and the transistor 206 are turned on. A current leakage suppressor 212 is operable to suppress the power consumption caused by current leakage. When the memory is not being accessed, the current leakage suppressor 212 forces the voltage V (across the transistor 206) to approach zero so that the current approaches to zero.

In this embodiment of FIG. 2, the transistor 206 is realized by an NMOS and the voltage V is the voltage difference between its drain and source. Because an NMOS almost blocks all current when the voltage difference between its drain and source approaches to near zero, almost no current leakage exists in the transistor 206 when the current leakage suppressor 212 forces the voltage V to be zero. Thus, the power dissipation caused by current leakage is efficiently suppressed when the memory is not being accessed.

The transistor 206 includes a first terminal and a second terminal which are the drain and source of the NMOS, respectively. In this embodiment shown in FIG. 2, the second terminal of the transistor 206 is coupled to a first ground. According to the status of the memory, the current leakage suppressor 212 couples a power supply input terminal of the current generator 208 to a voltage source $V_{DD}$ or a second ground GND. When the memory is being accessed, the current leakage suppressor 212 couples the power supply input terminal of the current generator 208 to the voltage source $V_{DD}$, so that the current generator 208 works normally to generate the control current I. When the memory is not being accessed, the current leakage suppressor 212 couples the power supply input terminal of the current generator 208 to the second ground GND, so that the voltage level of the first terminal of the transistor 206 is forced to approach zero volt and the voltage V across the transistor 206 is forced to approach zero. Thus, the transistor 206 blocks all current, including current leakage when the memory is not being accessed, and the power dissipation caused by current leakage is successfully reduced.

Referring to FIG. 2, the current leakage suppressor 212 includes an inverter 214, a first transmission gate 216 and a second transmission gate 218. The inverter 214 is operable to receive an enable signal EN and to output an opposite phase signal of the enable signal EN. The first transmission gate 216 is coupled between the second ground GND and the power supply input terminal of the current generator 208, and has a first control terminal coupled to the input terminal of the inverter 214 to receive the enable signal EN, and has a second control terminal coupled to the output terminal of the inverter 214 (via terminal $t_1$) to receive the opposite signal of the enable signal EN. The second transistor is coupled between the voltage source $V_{DD}$ and the power supply input terminal of the current generator 208, and has a first control terminal coupled to the output terminal of the inverter 214 (via terminal $t_1$) to receive the opposite signal of the enable signal EN, and has a second control terminal coupled to the input terminal of the inverter 214 to receive the enable signal EN. In this case, the enable signal EN is at a high voltage level when the memory is being accessed, and at a low voltage level otherwise. Thus, when the memory is being accessed (the enable signal EN is high), the first transmission gate 216 is turned off and the second transmission gate 218 is turned on so that the voltage source $V_{DD}$ is coupled to the power supply input terminal of the current generator 208 for generating the control current I. When the memory is not being accessed (the enable signal EN is low), the first transmission gate 216 is turned on and the second transmission gate 218 is turned off, so that the power supply input terminal of the current generator 208 is coupled to the second ground GND and the voltages across the transistors (such as V of 206) of the memory cells are forced to approach zero. Thus, when the memory is not being accessed, the current leakage is successfully suppressed. The reduced current leakage results in low power consumption of the memory.

The current leakage suppressor 212 may be realized by other circuits which couples the power supply input terminal of the current generator 208 to a voltage level equal to that of the second terminal of the transistor 206 when the memory is not being accessed. The memory cells (such as 202), current generator 208 and bit line selectors (such as 210) may be replaced by other equivalent circuits.

Figure 3:
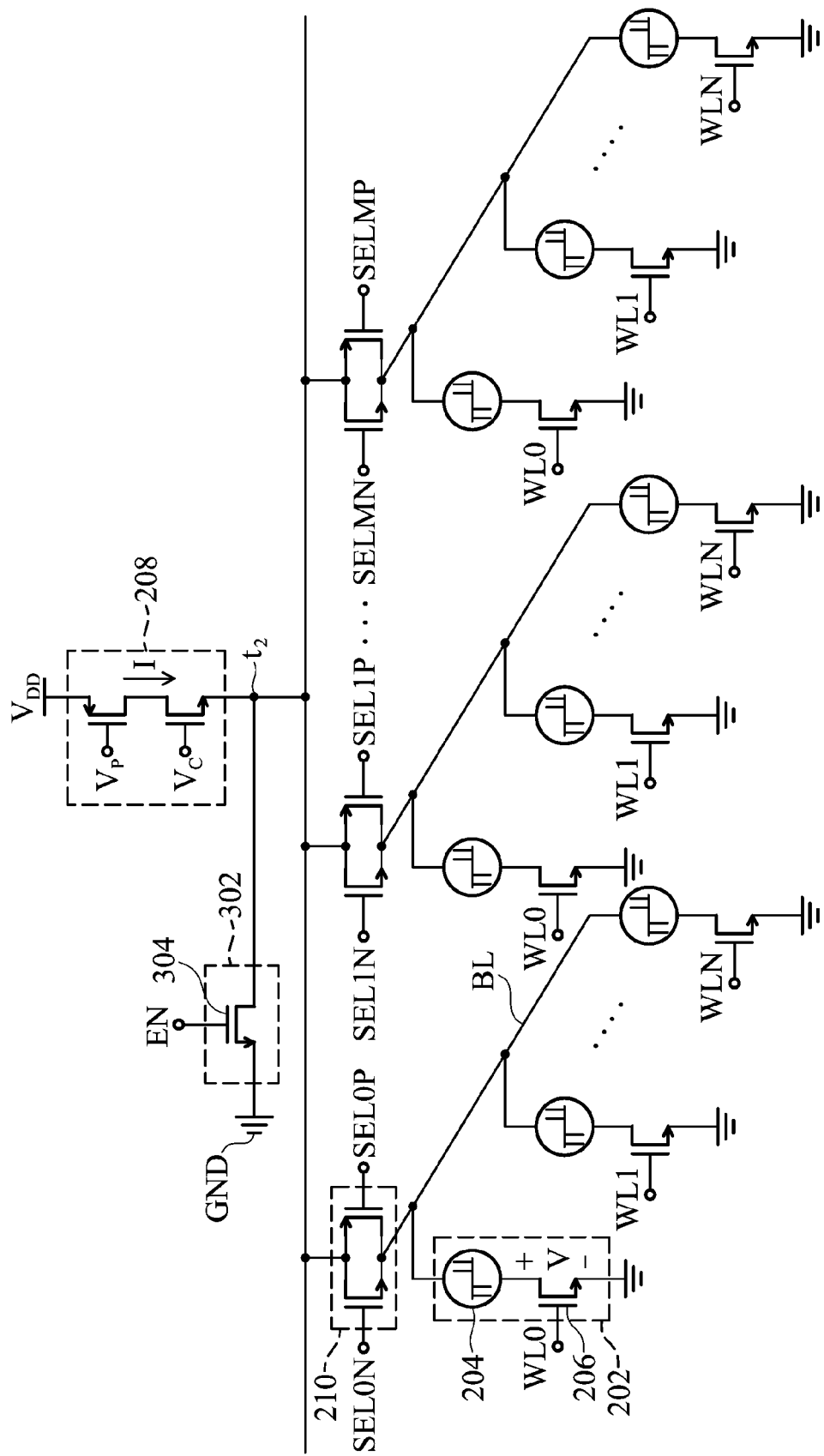
FIG. 3 illustrates another embodiment of the invention.

FIG. 3 illustrates another embodiment of the invention, wherein the current leakage suppressor is realized by circuit 302. The current leakage suppressor 302 is coupled to a connection terminal ($t_2$) located between the current generator 208 and the bit lines (such as BL) of the memory. When the memory is not being accessed, the current leakage suppressor 302 is turned on to couple the connection terminal $t_2$ to a third ground GND. Thus, the voltages across of the transistors (such as V of 206) are forced to approach zero and almost no current is allowed to flow into the memory cells (such as 202). The current leakage is successfully suppressed when the memory is not being accessed.

In the embodiment of FIG. 3, the current leakage suppressor 302 is realized by an NMOS 304, wherein the drain and source are coupled to the connection terminal $t_2$ and the third ground GND, respectively. The gate of the NMOS 304 receives an enable signal EN, which is a low voltage signal when the memory is being accessed and is a high voltage signal when the memory is not being accessed. Thus, when the memory is being accessed, the low voltage enable signal EN turns off the NMOS 304 and the current generator 208 works normally to supply a control current I. Alternatively, when the memory is not being accessed, the high voltage enable signal EN turns on the NMOS 304 and the connection terminal $t_2$ is coupled to the third ground GND, so that the transistors of the memory cells all have a near zero. Thus, current leakage is successfully suppressed when the memory is not being accessed. The reduced current leakage results in low power consumption of the memory.

The current leakage suppressor 302 may be realized by other circuit which couples a connection terminal, located between the current generator 208 and the bit lines (such as BL), to a voltage level equal to that of the second terminal of the transistor 206 when the memory is not being accessed. The memory cells (such as 202), current generator 208 and bit selectors (such as 210) may be replaced by other equivalent circuits.

The storage elements (such as 204) may be phase change storage element or any other storage elements.

Figure 4:
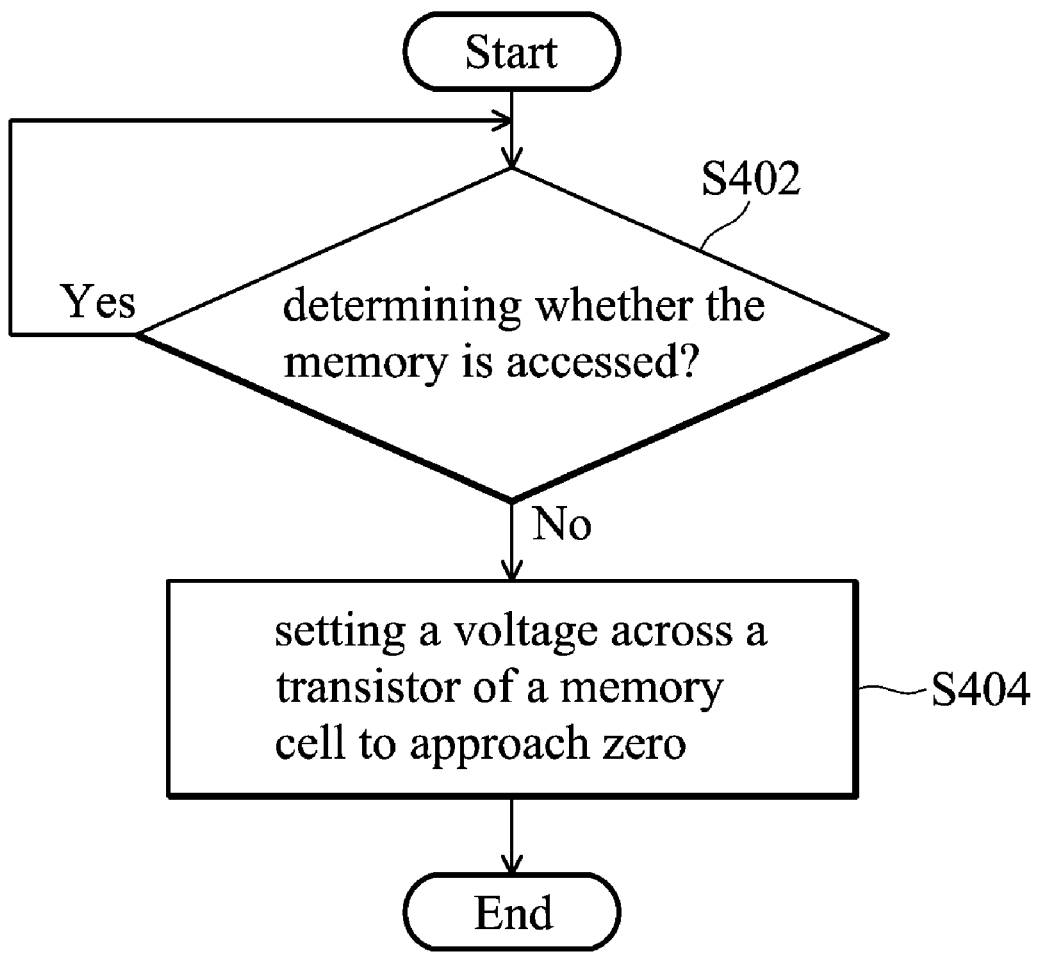
FIG. 4 is a flowchart illustrating an embodiment of the method of the invention.

The invention further discloses methods for suppressing current leakage of a memory. The memory includes at least one memory cell which includes a transistor and a storage element that are coupled in series. The transistor is controlled by a word line signal to conduct current through the storage element. FIG. 4 is a flowchart of an embodiment of the invention. Step S402 determines whether the memory is being accessed. When the memory is not being accessed, the process enters step S404 to force the voltage across the transistor to approach zero. The methods successfully suppress the current leakage when the memory is not being accessed since the transistor can efficiently block the current leakage when the voltage across it approaches zero. The reduced current leakage results in low power consumption of the memory.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A memory, comprising:
   a current generator, generating a control current;
   at least one bit line, coupled or dis-coupled to the current generator by a bit line selector;
   at least one memory cell, coupled to the bit line and comprising a transistor and a storage element that are coupled in series, wherein the transistor is turned on or off by a word line signal and the storage element is switched between a plurality of states according to current flowing therethrough; and
   a current leakage suppressor, comprising:
   an inverter, having an input terminal receiving an enable signal and an output terminal outputting an opposite phase signal of the enable signal;
   a first transmission gate, coupled between a ground and the power supply input terminal of the current source, and having a first control terminal and a second control terminal coupled to the input and output terminals of the inverter, respectively; and
   a second transmission gate, coupled between the voltage source and the power supply input terminal of the current source, and having a first control terminal and a second control terminal coupled to the output terminal and the input terminal of the inverter, respectively.

2. The memory as claimed in claim 1, wherein the transistor comprises a first terminal and a second terminal and the first terminal is coupled to the bit line.

3. The memory as claimed in claim 2, wherein the second terminal of the transistor is coupled to the ground.

4. The memory as claimed in claim 3, wherein the current leakage suppressor couples the current generator to a voltage source or the ground.

5. The memory as claimed in claim 4, wherein the current leakage suppressor is operable to couple a power supply input terminal of the current generator to the voltage source when the memory is being accessed, and couple the power supply input terminal of the current generator to the ground when the memory is not being accessed.

6. A memory, comprising:
   a current generator, generating a control current;
   at least one bit line, coupled or dis-coupled to the current generator by a bit line selector;
   at least one memory cell, coupled to the bit line and comprising a transistor and a storage element that are coupled in series, wherein the transistor is turned on or off by a word line signal and the storage element is switched between a plurality of states according to current flowing therethrough; and
   a current leakage suppressor, coupling an output terminal of the current generator to a ground when the memory is not being accessed,
   wherein the current leakage suppressor comprises a transistor comprising a first terminal, a second terminal and a control terminal coupled to the output terminal of the current generator, the ground and an enable signal, respectively, wherein the enable signal enables the transistor when the memory is not being accessed and disables the transistor when the memory is being accessed.

7. The memory as claimed in claim 1, wherein the storage element is phase change storage element.

8. The memory as claimed in claim 6, wherein the transistor comprises a first terminal and a second terminal and the first terminal is coupled to the bit line.

9. The memory as claimed in claim 8, wherein the second terminal of the transistor is coupled to the ground.

10. The memory as claimed in claim 9, wherein the current leakage suppressor couples the current generator to a voltage source or the ground.

11. The memory as claimed in claim 10, wherein the current leakage suppressor is operable to couple a power supply input terminal of the current generator to the voltage source when the memory is being accessed, and couple the power supply input terminal of the current generator to the ground when the memory is not being accessed.

12. The memory as claimed in claim 6, wherein the storage element is phase change storage element.

* * * * *